(12) United States Patent
Choi et al.

(10) Patent No.: US 8,106,425 B2
(45) Date of Patent: Jan. 31, 2012

(54) INTERCONNECTION SUBSTRATE, SEMICONDUCTOR CHIP PACKAGE INCLUDING THE SAME, AND DISPLAY SYSTEM INCLUDING THE SAME

(75) Inventors: Yun-seok Choi, Hwaseong-si (KR); Na-rae Shin, Yongin-si (KR); Hee-seok Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 357 days.

(21) Appl. No.: 11/819,628

(22) Filed: Jun. 28, 2007

(65) Prior Publication Data

US 2008/0023844 A1      Jan. 31, 2008

(30) Foreign Application Priority Data

Jul. 27, 2006   (KR) .................. 10-2006-0070887

(51) Int. Cl.
*H01L 23/52* (2006.01)
(52) U.S. Cl. ........ 257/207; 257/208; 257/691; 257/750; 257/E23.065
(58) Field of Classification Search .................. 257/459, 257/E23.065, 207, 208, 691; 349/151
See application file for complete search history.

(56) References Cited

U.S. PATENT DOCUMENTS

| | | | | |
|---|---|---|---|---|
| 4,628,343 A * | 12/1986 | Komatsu | ........ | 257/659 |
| 5,047,895 A * | 9/1991 | Sasaki | ........ | 361/749 |
| 5,670,815 A * | 9/1997 | Childs et al. | ........ | 257/386 |
| 6,573,711 B1 * | 6/2003 | Schaenzer et al. | ........ | 324/210 |
| 6,897,932 B2 * | 5/2005 | Murade et al. | ........ | 349/151 |
| 6,990,355 B2 * | 1/2006 | Ueyama et al. | ........ | 455/550.1 |
| 7,363,607 B2 * | 4/2008 | Birch et al. | ........ | 716/13 |

(Continued)

FOREIGN PATENT DOCUMENTS

JP        06-176838        6/1994

(Continued)

OTHER PUBLICATIONS

Chinese Office Action dated Jul. 27, 2010 issued in corresponding Chinese Application No. 200710139123.3.

*Primary Examiner* — Wael Fahmy
*Assistant Examiner* — John C Ingham
(74) *Attorney, Agent, or Firm* — Harness, Dickey & Pierce, P.L.C.

(57) ABSTRACT

Example embodiments relate to an interconnection substrate and a semiconductor chip package and a display system including the same. The interconnection substrate may include a base film, a signal line provided on the base film, a power line provided on the base film as a line pattern including a plurality of bent portions, and a ground line provided on the base film in parallel with the power line. The interconnection substrate may further include a semiconductor chip provided on the base film, wherein the power, ground, and/or signal lines are electrically connected to the semiconductor chip to form a semiconductor chip package. A display system may include the above semiconductor chip package, a screen displaying an image, and a PCB generating a signal. The semiconductor chip may be connected between the PCB and the screen and relay the generated signal from the PCB to the screen. Use of the power, ground, and/or signal lines having a plurality of bent portions may reduce electromagnetic interference (EMI) within the display system.

22 Claims, 9 Drawing Sheets

U.S. PATENT DOCUMENTS

2002/0109814 A1* 8/2002 Murahashi et al. ............ 349/151
2002/0171638 A1* 11/2002 Ishiyama ...................... 345/205
2003/0136578 A1* 7/2003 Kishimoto et al. ............ 174/255
2006/0076158 A1* 4/2006 Umeyama et al. ............ 174/254
2006/0108694 A1 5/2006 Hung et al.
2007/0012774 A1* 1/2007 Cho et al. ...................... 235/435

FOREIGN PATENT DOCUMENTS

| | | |
|---|---|---|
| JP | 07-066519 | 3/1995 |
| JP | 10-178052 | 6/1998 |
| JP | 2002-043762 | 2/2002 |
| JP | 2006-100664 | 4/2006 |

* cited by examiner

FIG. 8

|  | 3 nH | 10 nH | 25 nH | 50 nH |
|---|---|---|---|---|
| EMI LEVEL (dBµV/m) | 25 | 22.5 | 22.5 | 20 |

INTERCONNECTION SUBSTRATE, SEMICONDUCTOR CHIP PACKAGE INCLUDING THE SAME, AND DISPLAY SYSTEM INCLUDING THE SAME

PRIORITY STATEMENT

This application claims priority under 35 U.S.C. 119(a) to Korean Patent Application No. 10-2006-0070887, filed on Jul. 27, 2006 in the Korean Intellectual Property Office (KIPO), the entire contents of which are incorporated herein by reference.

BACKGROUND

1. Technical Field

Example embodiments relate to an interconnection substrate, a semiconductor chip package including the same, and a display system including the same. Example embodiments also relate to a film interconnection substrate including power and ground lines, a semiconductor chip package including the same, and a flat panel display system including the same.

2. Description of the Related Art

With the development of miniaturization and weight-reduction technologies in the semiconductor field, various flat panel display systems having improved functions and performance have been realized. Examples of flat panel display systems may include liquid crystal displays (LCDs), field emission displays (FEDs), plasma screens (PDPs), and electro-luminescence displays (ELDs).

A flat panel display system may include a semiconductor chip having a driving circuit to supply a driving signal to a display panel/screen. However, the semiconductor chip may generate electromagnetic interference (EMI), thus decreasing the performance of the flat panel display system. Consequently, much research has been conducted to find a method to reduce or eliminate EMI.

In a conventional method of reducing EMI, additional components (e.g., a ferrite core, an inductor, and a capacitor) may be added to a system board. However, employing additional components may increase the product, development, and maintenance costs of the flat panel display system. Furthermore, completely reducing or eliminating EMI may be difficult using the conventional EMI reduction method, because the system board may, in effect, become an antenna.

Another method has been introduced, where a separate component may be disposed between a system board and a display panel/screen to filter out high-frequency noises. However, the above-described problems (e.g., increased product cost) may still remain when using this method.

SUMMARY OF EXAMPLE EMBODIMENTS

Example embodiments relate to an interconnection substrate that may reduce the electromagnetic interference (EMI) generated by a semiconductor chip used to drive a display panel/screen. Example embodiments also relate to a semiconductor chip package including the interconnection substrate and a display system including the semiconductor chip package having the interconnection substrate.

An interconnection substrate may include a flexible base film made of an insulation material and have a mounting surface for receiving a semiconductor chip. One or more signal, power, and ground lines may be provided on the base film, where the power line may be a line pattern having a plurality of bent portions, and the ground line may extend in parallel to the power line. The signal line may also be a line pattern having a plurality of bent portions. The base film may include a first surface and a second surface on the opposite side of the first surface, with the power, ground, and/or signal lines provided on the first and/or second surfaces. The base film may further include one or more via holes extending from the first surface to the second surface. The power, ground, and/or signal lines may extend from the first surface to the second surface through the via holes. The signal, power, and ground line patterns may include a zigzag/meander, loop, spiral, coil, or a combination thereof. A semiconductor chip package may include the above interconnection substrate and one or more semiconductor chips mounted on the mounting surface of the interconnection substrate. The power, ground, and/or signal lines may be electrically connected to the semiconductor chip.

A flat panel display system may include the above semiconductor chip package, a screen displaying an image, and a printed circuit board generating a signal (e.g., driving signal) to the screen. The semiconductor chip may be connected between the screen and the printed circuit board by one or more signal lines so as to relay the generated signal from the printed circuit board to the screen. Additionally, the power and ground lines may electrically connect the semiconductor chip to the printed circuit board. Furthermore, the power and ground lines may electrically connected to the printed circuit board to the screen.

High-frequency noise may be transmitted through the power and ground lines during the operation of the flat panel display system. However, the increased lengths of the power and ground lines due to line patterns having a plurality of bent portions may increase the inductances of the power and ground lines, thus reducing the transmission of high-frequency noise. Additionally, the power and ground lines may be relatively close to and parallel to each other, thus increasing the capacitance between the power and ground lines. Accordingly, the operating speed of the semiconductor chip may increase, thus enabling stable operation of the semiconductor chip with reduced EMI.

BRIEF DESCRIPTION OF THE DRAWINGS

FIG. 8 is a table showing EMI levels measured from a flat panel display system including power and ground lines having a zigzag/meandering pattern with respect to different inductance levels according to example embodiments.

DETAILED DESCRIPTION OF EXAMPLE EMBODIMENTS

Figure 1:
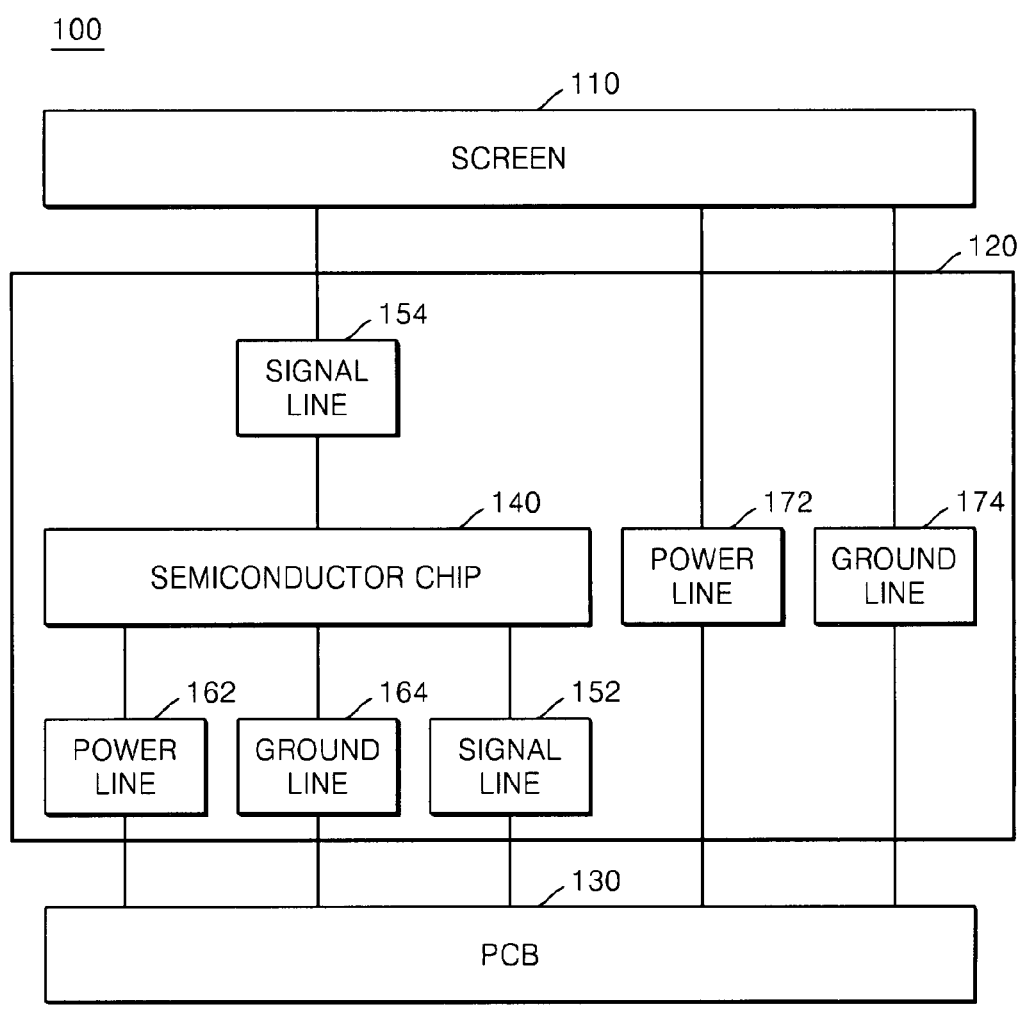
FIG. 1 is a block diagram schematically illustrating a flat panel display system according to example embodiments.

Example embodiments will be described below in more detail with reference to the accompanying drawings. Example embodiments may, however, be embodied in different forms and should not be constructed as limited to the ones set forth herein. Rather, these example embodiments have been provided so that this disclosure will be thorough and fully convey the scope of the disclosure to those skilled in the art. In the figures, the dimensions of the layers and regions may have been exaggerated for purposes of illustration.

It will be understood that when an element or layer is referred to as being "on", "connected to", "coupled to", or "covering" another element or layer, it can be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

An interconnection substrate may include a base film having a mounting surface for receiving one or more semiconductor chips. One or more signal, power, and ground lines having a plurality of bent portions may also be provided on the base film. The base film may be made of a flexible insulation material (e.g., a polyamide resin, polyester resin) for reducing the size and weight of the display system. A semiconductor chip package may include the above interconnection substrate and one or more semiconductor chips mounted on the interconnection substrate and electrically connected to the signal, power, and/or ground lines. For example, the semiconductor chip package may be a chip on film (COF) package, but is not limited thereto, as the interconnection substrate may be used to create other flexible printed circuit film structures. A display system may include the above semiconductor chip package, a screen for displaying an image, and a printed circuit board (PCB) generating a signal (e.g., driving signal). A semiconductor chip may be connected between the PCB and the screen to relay the generated signal from the PCB to the screen. Example embodiments of the interconnection substrate, semiconductor chip package, and display system are provided herein.

FIG. 1 is a block diagram schematically illustrating a display system (e.g., flat panel display system) 100 according to example embodiments. Referring to FIG. 1, the display system 100 may include a screen (e.g., flat display panel, liquid crystal display panel) 110, a semiconductor chip (e.g., source drive IC) 140 mounted on an interconnection substrate (e.g., film interconnection substrate) 120, and a PCB (e.g., source drive PCB) 130. The PCB 130 may generate a signal (e.g., driving signal) which may be relayed by the semiconductor chip 140 from the PCB 130 to the screen 110. Though not shown in FIG. 1, the PCB 130 may include a power unit which powers a memory, a program unit, and/or a buffer in the PCB 130 using an external power supply. The power unit (not shown) of the PCB 130 may also supply power through the interconnection substrate 120 to the screen 110 to enable the display of images.

One or more signal lines 152 may be provided on the interconnection substrate 120 between the semiconductor chip 140 and the PCB 130. The signal lines 152 may constitute an input circuit. Additionally, one or more signal lines 154 may be provided on the interconnection substrate 120 between the semiconductor chip 140 and the screen 110. The signal lines 154 may constitute an output circuit. Furthermore, the signal lines 152 and 154 may be provided on the interconnection substrate 120 as line patterns having a plurality of bent portions.

One or more power lines 162 may be provided on the interconnection substrate 120 between the semiconductor chip 140 and the PCB 130. Additionally, one or more power lines 172 may be provided on the interconnection substrate 120 between the PCB 130 and the screen 110. Power lines 162 and 172 may be analog lines or digital lines.

One or more ground lines 164 may be provided on the interconnection substrate 120 between the semiconductor chip 140 and the PCB 130. Additionally, one or more ground lines 174 may be provided on the interconnection substrate 120 between the PCB 130 and the screen 110. Ground lines 164 and 174 may be analog lines or digital lines.

A power line 162 may be paired with a ground line 164, and one or more pairs of power line 162 and ground line 164 may be provided on the interconnection substrate 120 between the semiconductor chip 140 and the PCB 130. Additionally, a power line 172 may be paired with a ground line 174, and one or more pairs of power line 172 and ground line 174 may be provided on the interconnection substrate 120 between the PCB 130 and the screen 110. The power line 162 may be parallel to the ground line 164, and the power line 172 may be parallel to the ground line 174. Furthermore, the power lines 162 and 172 and ground lines 164 and 174 may be provided on the interconnection substrate 120 as line patterns having a plurality of bent portions.

Figure 2A:
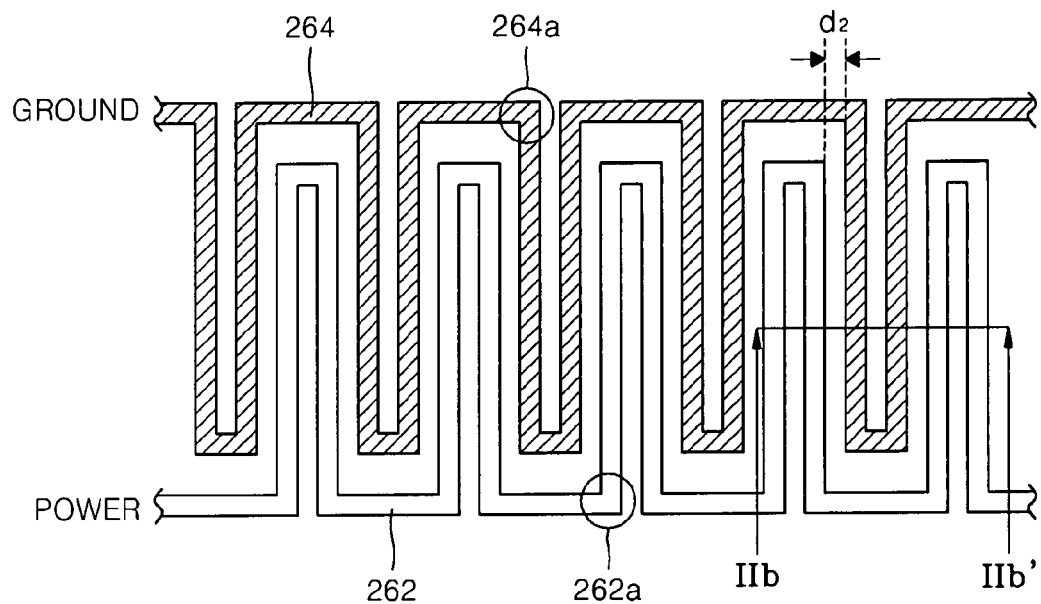
FIG. 2A is a plan view illustrating power and ground lines having a zigzag/meandering line pattern according to example embodiments.

FIG. 2A is a plan view illustrating a first line pattern 262 for the power line 162 and a second line pattern 264 for the ground line 164 in the display system 100 according to example embodiments. Referring to FIG. 2A, the first and second line patterns 262 and 264 have a zigzag or other meandering pattern for the power and ground lines 162 and 164, respectively, on the interconnection substrate 120 (FIG. 1).

Figure 2B:
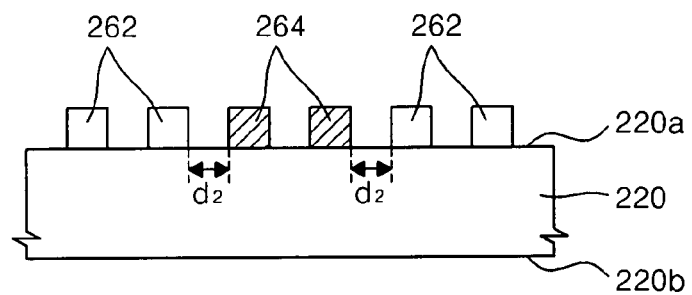
FIG. 2B is an enlarged cross-sectional view taken along line IIb-IIb' of FIG. 2A according to example embodiments.

FIG. 2B is an enlarged cross-sectional view taken along line IIb-IIb' of FIG. 2A. Referring to FIG. 2B, the first line pattern 262 for the power line 162 and the second line pattern 264 for the ground line 164 may be provided on a base film 220 of the interconnection substrate 120. The base film 220 of the interconnection substrate 120 may include a first surface 220a and a second surface 220b on the opposite side of the first surface 220a. Though not shown, the semiconductor chip 140 may be mounted on the first surface 220a of the base film 220. As illustrated in FIG. 2B, the first and second line patterns 262 and 264 may be provided on the first surface 220a. Alternatively, the first and second line patterns 262 and 264 may be provided on the first surface 220a and/or second surface 220b. The first and second line patterns 262 and 264 may be made of a conductive material (e.g., Cu).

Referring to FIG. 2A, because the first and second line patterns 262 and 264 may be provided as zigzagging/meandering patterns having a plurality of bent portions 262a and 264a, the power and ground lines 162 and 164 may be relatively long when compared to conventional power and ground lines having relatively straight structures without bent portions. As illustrated in FIG. 2A, the plurality of bent portions (e.g., 262a and 264a) allows a greater line length to fit within a given space. Due to their increased lengths, the power and ground lines 162 and 164 may have increased inductances, which may hinder (or filter) the passage of high-frequency noises through the power and ground lines 162 and 164. As a result, the power and ground lines 162 and 164 may reduce (or prevent) the transmittal of high-frequency noises and EMI fields, that may be generated by the semiconductor chip 140 and the source drive PCB 130, to the screen 110.

The distance $d_2$ between the first and second line patterns 262 and 264 may be sufficiently short, such that parasitic capacitance may exist between the first and second line patterns 262 and 264. Therefore, the first and second line patterns 262 and 264 may operate as electrodes of a capacitor, and the capacitance between the power and ground lines 162 and 164 may increase due to the parasitic capacitance. Consequently, the power and ground lines 162 and 164 may function as a local battery for the semiconductor chip (e.g., source drive IC) 140, thus enabling stable operation due to the increased operating speed of the semiconductor chip 140.

Figure 3A:
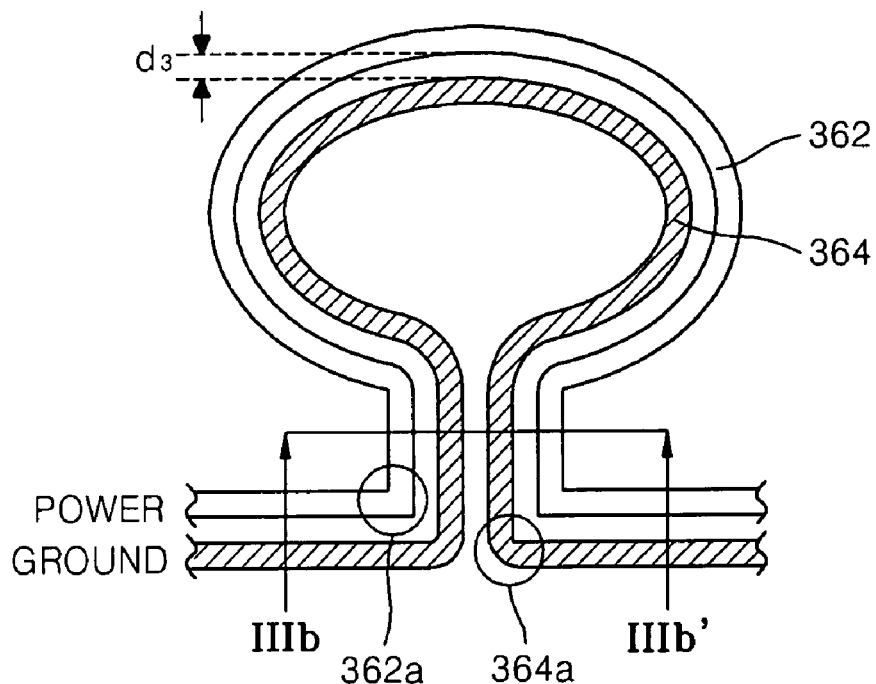
FIG. 3A is a plan view illustrating power and ground lines having a loop line pattern according to example embodiments.

FIG. 3A is a plan view illustrating a first line pattern 362 for the power line 162 and a second line pattern 364 for the ground line 164 in the display system 100 according to example embodiments. Referring to FIG. 3A, the first and second line patterns 362 and 364 may have a loop structure for the power and ground lines 162 and 164 on the interconnection substrate 120 (FIG. 1), respectively.

Figure 3B:
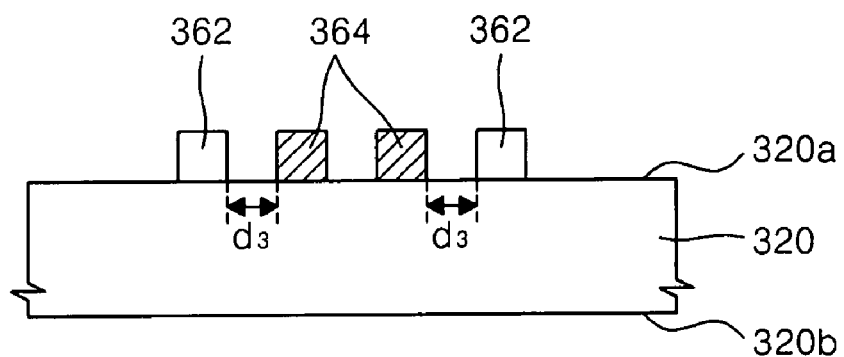
FIG. 3B is an enlarged cross-sectional view taken along line IIIb-IIIb' of FIG. 3A according to example embodiments.

FIG. 3B is an enlarged cross-sectional view taken along line IIIb-IIIb' of FIG. 3A. Referring to FIG. 3B, the first line pattern 362 for the power line 162 and the second line pattern 364 for the ground line 164 may be provided on a base film 320 of the interconnection substrate 120. The base film 320 may include a first surface 320a and a second surface 320b on the opposite side of the first surface 320a. Though not shown, the semiconductor chip 140 may be provided on the first surface 320a of the base film 320. As illustrated in FIG. 3B, the first and second line patterns 362 and 364 may be provided on the first surface 320a. Alternatively, the first and second line patterns 362 and 364 may be provided on the first surface 320a and/or second surface 320b. The first and second line patterns 362 and 364 may be made of a conductive material (e.g., Cu).

As shown in FIG. 3A, the first and second line patterns 362 and 364 may be a loop having a plurality of bent portions 362a and 364a. Because the first and second line patterns 362 and 364 may have relatively long lengths when compared to conventional power and ground lines having relatively straight structures without bent portions, the first and second line patterns 362 and 364 may have increased inductances. Thus, high-frequency noises may be reduced or filtered by the power and ground lines 162 and 164 provided on the base film 320, and EMI may be reduced. In addition, the first and second line patterns 362 and 364 may be provided on the base film 320 in parallel with each other. The distance $d_3$ between the first and second line patterns 362 and 364 may be sufficiently short, such that parasitic capacitance may exist between the first and second line patterns 362 and 364. Therefore, the first and second line patterns 362 and 364 may operate as electrodes of a capacitor, and the capacitance between the power and ground lines 162 and 164 may increase due to the parasitic capacitance. Accordingly, the operating speed of the semiconductor chip 140 may increase, thus enabling the stable operation of a semiconductor chip 140.

Figure 4A:
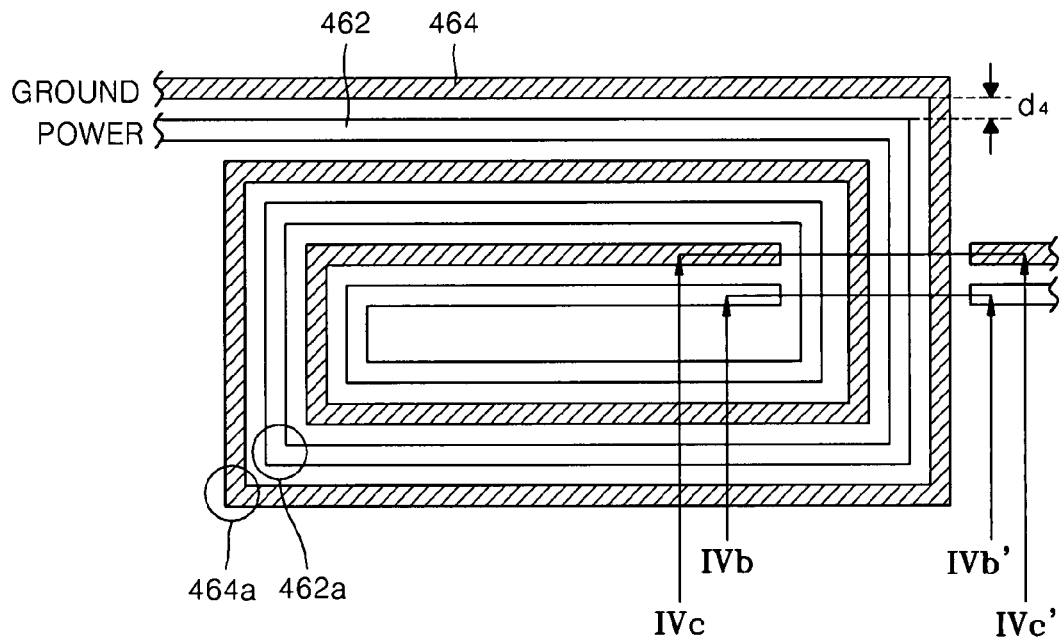
FIG. 4A is a plan view illustrating power and ground lines having a spiral line pattern according to example embodiments.

FIG. 4A is a plan view illustrating a first line pattern 462 for the power line 162 and a second line pattern 464 for the ground line 164 in the display system 100 according to example embodiments. Referring to FIG. 4A, the first and second line patterns 462 and 464 may have a spiral structure for the power and ground lines 162 and 164 on the interconnection substrate 120 (FIG. 1), respectively.

Figure 4B:
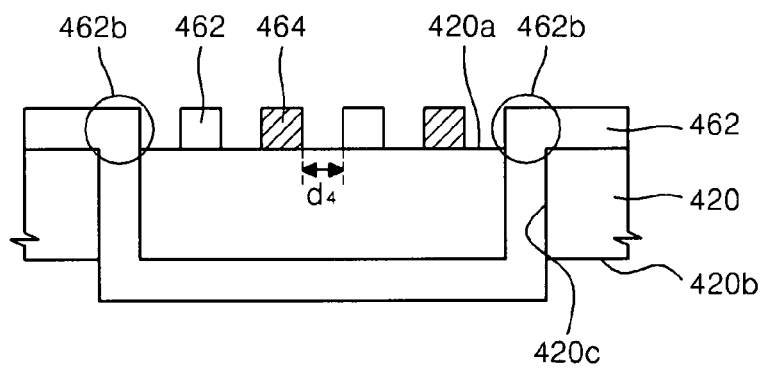
FIG. 4B is an enlarged cross-sectional view taken along line IVb-IVb' of FIG. 4A according to example embodiments.
Figure 4C:
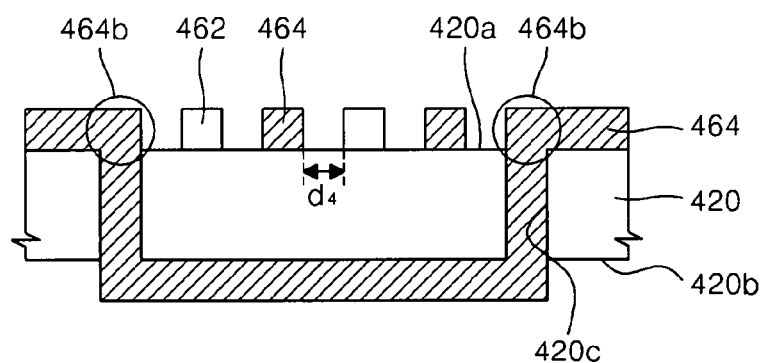
FIG. 4C is an enlarged cross-sectional view taken along line IVc-IVc' of FIG. 4A according to example embodiments.

FIG. 4B is an enlarged cross-sectional view taken along line IVb-IVb' of FIG. 4A, and FIG. 4C is an enlarged cross-sectional view taken along line IVc-IVc' of FIG. 4A. Referring to FIGS. 4B and 4C, the first line pattern 462 for the power line 162 and the second line pattern 464 for the ground line 164 may be provided on a base film 420 of the interconnection substrate 120. The base film 420 of the interconnection substrate 120 may include a first surface 420a and a second surface 420b on the opposite side of the first surface 420a. Though not shown, the semiconductor chip 140 may be provided on the first surface 420a of the base film 420. Via holes 420c may extend from the first surface 420a to the second surface 420b of the base film 420. The first and second line patterns 462 and 464 may extend from the first surface 420a to the second surface 420b through the via holes 420c. The first and second line patterns 462 and 464 may be made of a conductive material (e.g., Cu).

As shown in FIGS. 4A, 4B, and 4C, the first and second line patterns 462 and 464 may be a spiral having a plurality of bent portions 462a, 462b, 464a, and 464b. Because the first and second line patterns 462 and 464 may have a relatively long length when compared to conventional power and ground lines having relatively straight structures without bent portions, the first and second line patterns 462 and 464 may have increased inductances. Consequently, high-frequency noises may be reduced or filtered by the power and ground lines 162 and 164 provided on the base film 420, and EMI may be reduced. In addition, the first and second line patterns 462 and 464 may be provided on the base film 420 in parallel with each other. The distance $d_4$ between the first and second line patterns 462 and 464 may be sufficiently short, such that parasitic capacitance may exist between the first and second line patterns 462 and 464. Therefore, the first and second line patterns 462 and 464 may operate as electrodes of a capacitor, and the capacitance between the power and ground lines 162 and 164 may increase due to the parasitic capacitance. Accordingly, the operating speed of the semiconductor chip 140 may increase, thus enabling stable operation of the semiconductor chip 140.

Figure 5A:
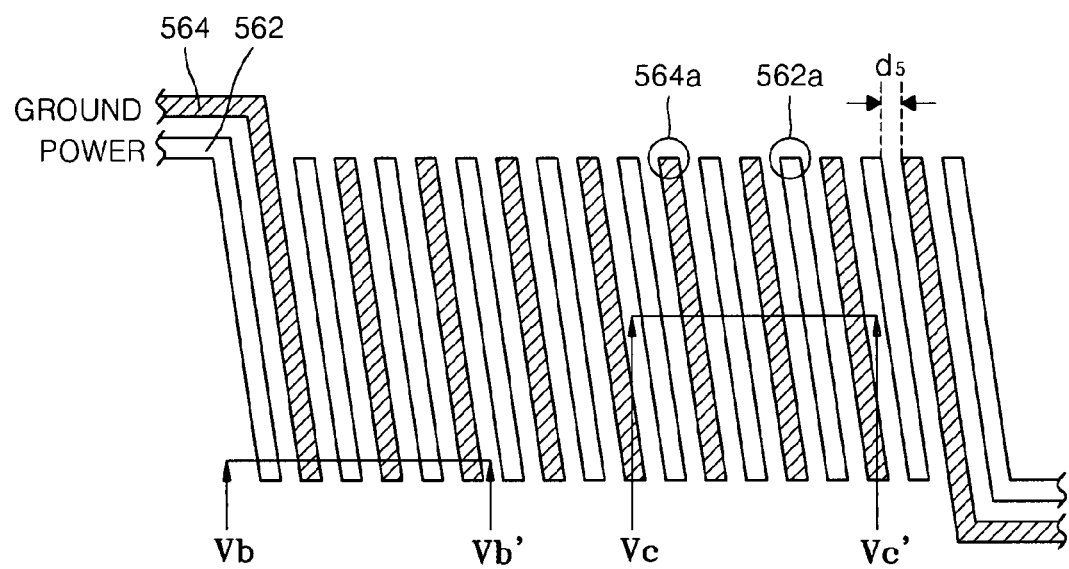
FIG. 5A is a plan view illustrating power and ground lines having a coil line pattern according to example embodiments, as viewed from the first surface of a base film.

FIG. 5A is a plan view illustrating a first line pattern 562 for the power line 162 and a second line pattern 564 for the ground line 164 in the display system 100 according to example embodiments. Referring to FIG. 5A, the first and second line patterns 562 and 564 may have a coil structure for the power and ground lines 162 and 164, respectively, on the interconnection substrate 120 (FIG. 1).

Figure 5B:
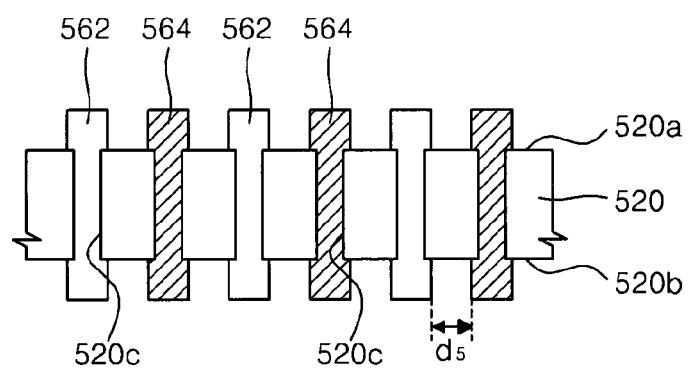
FIG. 5B is an enlarged cross-sectional view taken along line Vb-Vb' of FIG. 5A according to example embodiments.
Figure 5C:
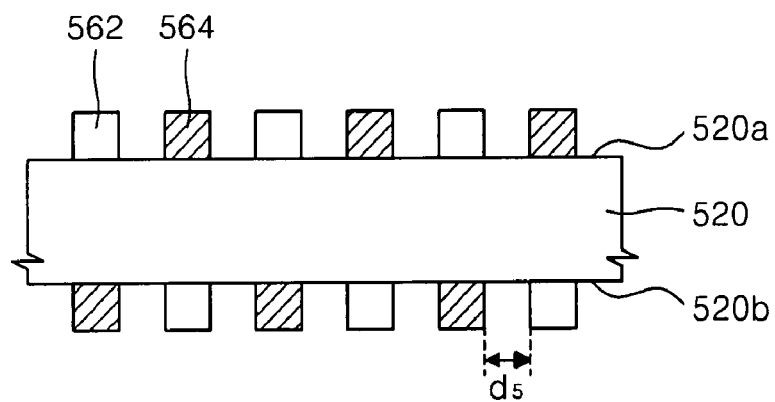
FIG. 5C is an enlarged cross-sectional view taken along line Vc-Vc' of FIG. 5A according to example embodiments.

FIG. 5B is an enlarged cross-sectional view taken along line Vb-Vb' of FIG. 5A, and FIG. 5C is an enlarged cross-sectional view taken along line Vc-Vc' of FIG. 5A. Referring to FIG. 5B, the first line pattern 562 for the power line 162 and the second line pattern 564 for the ground line 164 may be provided on a base film 520 of the interconnection substrate 120. The base film 520 of the interconnection substrate 120 may include a first surface 520a and a second surface 520b on the opposite side of the first surface 520a. Though not shown, a semiconductor chip 140 may be provided on the first surface 520a of the base film 520. Via holes 520c may extend from the first surface 520a to the second surface 520b of the base film 520.

Figure 5D:
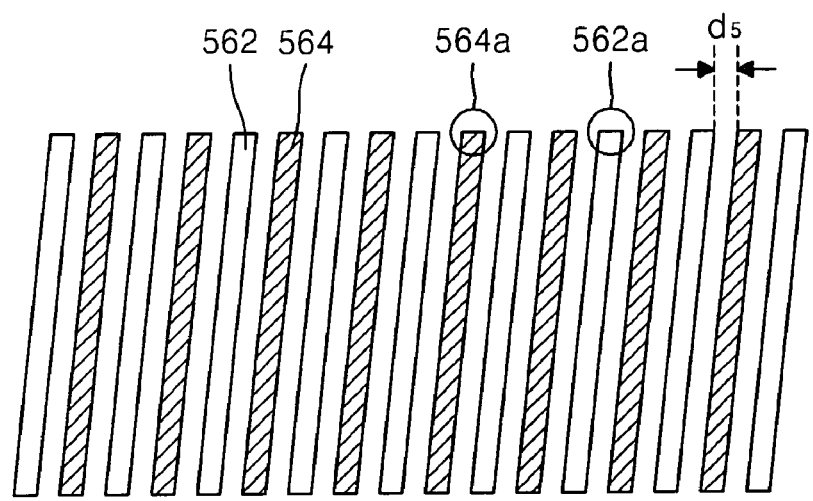
FIG. 5D is a plan view illustrating power and ground lines having a coil line pattern according to example embodiments, as viewed from the second surface of a base film.

Referring to FIGS. 5A through 5D, the first and second line patterns 562 and 564 may extend from the first surface 520a to the second surface 520b through the via holes 520c. The first and second line patterns 562 and 564 may be wound around the base film 520 through the via holes 520c in the form of a coil, such that each of the first and second line patterns 562 and 564 may be provided on the first and second surfaces 520a and 520b in turns. The first and second line patterns 562 and 564 may be made of a conductive material (e.g., Cu). FIG. 5A illustrates portions of the first and second line patterns 562 and 564 that may be provided on the first surface 520a of the base film 520, while FIG. 5D illustrates portions of the first and second line patterns 562 and 564 that may be provided on the second surface 520b of the base film 520.

As shown in FIGS. 5A through 5D, the first and second line patterns 562 and 564 may be a coil having a plurality of bent portions 562a and 564a. Because the first and second line patterns 562 and 564 may have a relatively long lengths when compared to conventional power and ground lines having relatively straight structures without bent portions, first and second line patterns 562 and 564 may have increased inductances. Consequently, high-frequency noises may be reduced or filtered by the power and ground lines 162 and 164 provided on the base film 520, and EMI may be reduced. In addition, the first and second line patterns 562 and 564 may be provided in parallel with each other. The distance $d_5$ between the first and second line patterns 562 and 564 may be sufficiently short, such that parasitic capacitance may exist between the first and second line patterns 562 and 564. Therefore, the first and second line patterns 562 and 564 may operate as electrodes of a capacitor, and the capacitance between the power and ground lines 162 and 164 may increase due to the parasitic capacitance. Accordingly, the operating speed of the semiconductor chip 140 may increase, thus enabling stable operation of the semiconductor chip 140.

Figure 6A:
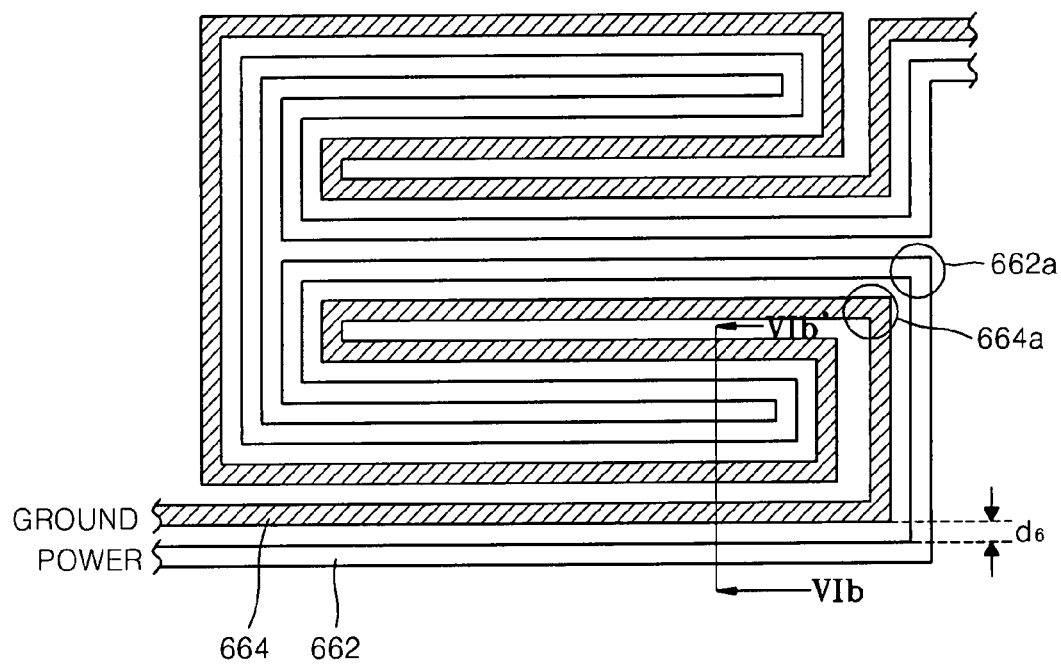
FIG. 6A is a plan view illustrating power and ground lines having a combined zigzag/meandering pattern and loop pattern according to example embodiments.

FIG. 6A is a plan view illustrating a first line pattern 662 for the power line 162 and a second line pattern 664 for the ground line 164 in the display system 100 according to example embodiments. Referring to FIG. 6A, the first and second line patterns 662 and 664 may have a combined structure of a modified zigzag/meander and a modified loop for the power and ground lines 162 and 164 on the interconnection substrate 120 (FIG. 1). Alternatively, the first and second line patterns 662 and 664 may include a combination of other line patterns.

Figure 6B:
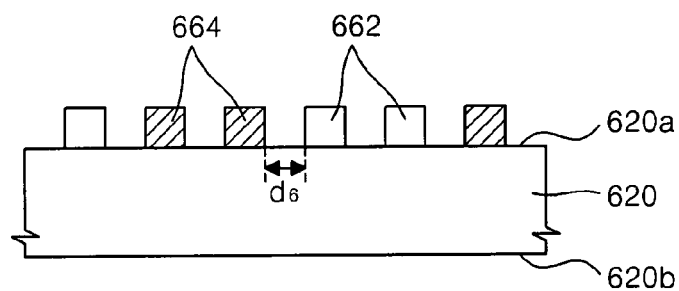
FIG. 6B is an enlarged cross-sectional view taken along line VIb-VIb' of FIG. 6A according to example embodiments.

FIG. 6B is an enlarged cross-sectional view taken along line VIb-VIb' of FIG. 6A. Referring to FIG. 6B, the first line pattern 662 for the power line 162 and the second line pattern 664 for the ground line 164 may be provided on a base film 620 of the interconnection substrate 120. Referring to FIG. 6B, the base film 620 of the interconnection substrate 120 may include a first surface 620a and a second surface 620b on the opposite side of the first surface 620a. Though not shown, the semiconductor chip 140 may be provided on the first surface 620a of the base film 620. As illustrated in FIG. 6B, the first and second line patterns 662 and 664 may be provided on the first surface 620a of the base film 620. Alternatively, the first and second line patterns 662 and 664 may be provided on the first surface 620a and/or the second surface 620b of the base film 620. The first and second line patterns 662 and 664 may be made of a conductive material (e.g., Cu).

As shown in FIGS. 6A and 6B, the first and second line patterns 662 and 664 may be a combined structure of a modified zigzag/meander and a modified loop having a plurality of bent portions 662a and 664a. Because the first and second line patterns 662 and 664 may have a relatively long lengths when compared to conventional power and ground lines having relatively straight structures without bent portions, the first and second line patterns 662 and 664 may have increased inductances. Consequently, high-frequency noises may be reduced or filtered by the power and ground lines 162 and 164 provided on the base film 620, and EMI may be reduced. In addition, the first and second line patterns 662 and 664 may be provided on the base film 620 in parallel with each other. The distance $d_6$ between the first and second line patterns 662 and 664 may be sufficiently short, such that parasitic capacitance may exist between the first and second line patterns 662 and 664. Therefore, the first and second line patterns 662 and 664 may operate as electrodes of a capacitor, and the capacitance between the power and ground lines 162 and 164 may increase due to the parasitic capacitance. Accordingly, the operating speed of the semiconductor chip 140 may increase, thus enabling stable operation of the semiconductor chip 140.

The structures illustrated in FIGS. 2A through 6B may also be applied to the power and ground lines 172 and 174 (FIG. 1). By increasing the lengths of the power and ground lines 172 and 174 with line patterns having a plurality of bent portions, the inductance of the power and ground lines 172 and 174 may be increased. Consequently, high-frequency noises may be reduced or filtered by the power and ground lines 172 and 174, and EMI may be reduced. Furthermore, the power and ground lines 172 and 174 may be provided in parallel at a sufficiently close distance such that the capacitance between the power and ground lines 172 and 174 may be increased due to parasitic capacitance. Accordingly, the operating speed of the semiconductor chip 140 may increase, thus enabling stable operation of the semiconductor chip 140.

Additionally, the structures illustrated in FIGS. 2A through 6B may be applied to the signal lines 152 and 154 (FIG. 1). By increasing the lengths of the signal lines 152 and 154 with line patterns having a plurality of bent portions, the inductance of the signal lines 152 and 154 may be increased. Consequently, the transmittal of high-frequency noises and EMI may be reduced. While example structures are illustrated in FIGS. 2A through 6B, the specification is not limited to the illustrated structures. A variety of line patterns having a plurality of bent portions may be used for the power, ground, and signal lines.

Figure 7A:
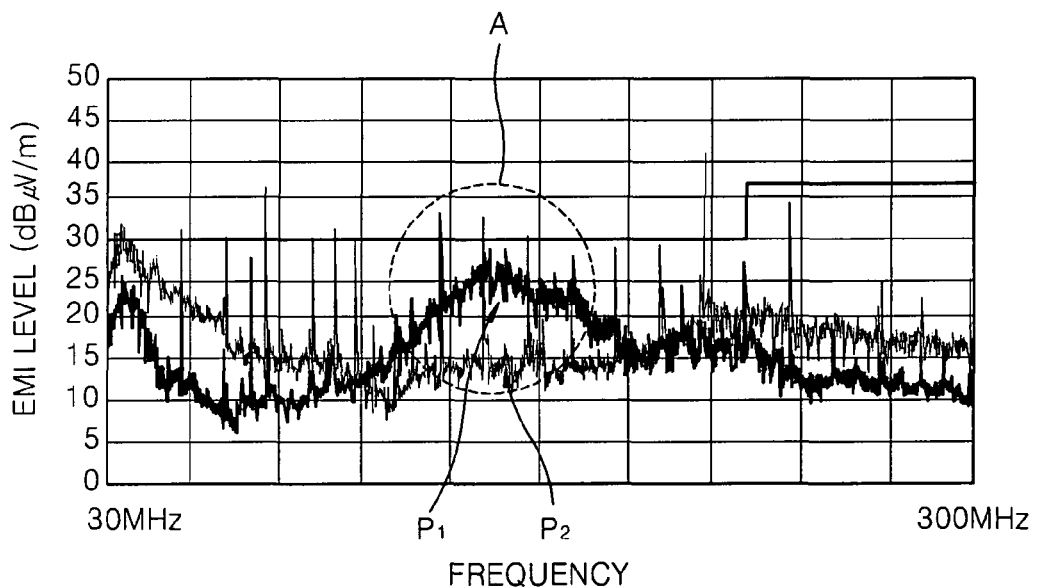
FIG. 7A is a graph showing electromagnetic interference (EMI) test results of a flat panel display system using power and ground lines having a zigzag/meandering pattern according to example embodiments.

FIG. 7A is a graph showing EMI test results of a display system employing line patterns having a plurality of bent portions according to example embodiments. The EMI test of FIG. 7A was performed on a liquid crystal display (LCD), in which the power and ground lines having a zigzagging/meandering structure (as shown in FIGS. 2A and 2B) were connected between a PCB (source drive PCB) and a semiconductor chip (source drive IC). The LCD was operated at a frequency range of about 30 MHz to about 300 MHz, and the electric field level (EMI level) was measured using an antenna placed about 3 m away from a screen of the LCD. Two LCD samples with the same power and ground line structure were used to obtain the graph of FIG. 7A in which a peak $P_1$ was measured from one sample, and a peak $P_2$ was measured from the other sample.

Figure 7B:
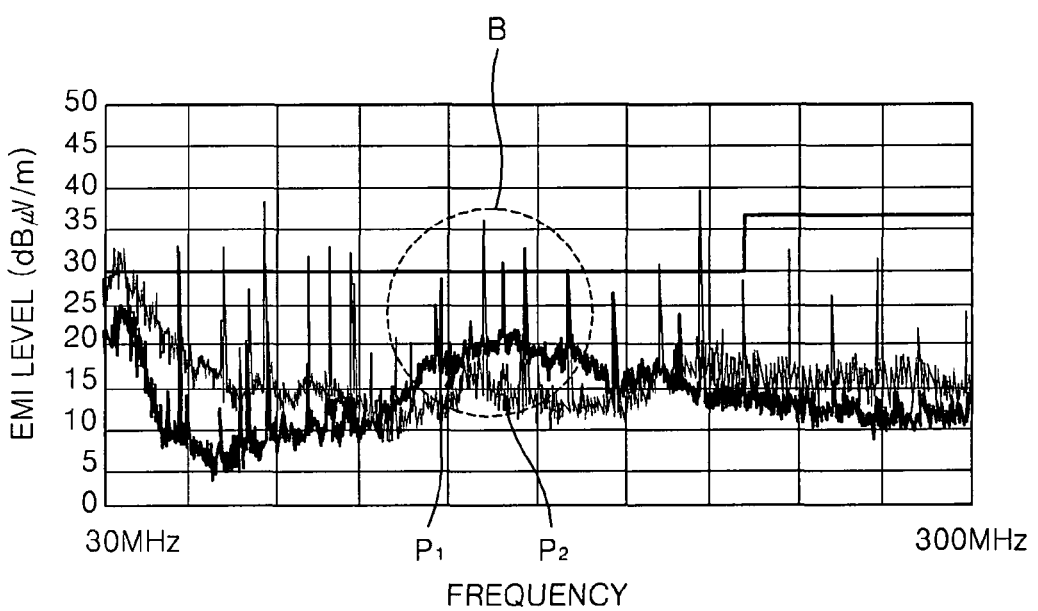
FIG. 7B is a graph showing EMI test results of a comparison sample using a power line and a ground line having a conventional linear structure.

FIG. 7B is a graph showing EMI test results of a comparison sample using power and ground lines having a conventional linear structure. FIG. 7B was obtained using the same LCDs and test method as in FIG. 7A except that the LCD samples of FIG. 7B were configured with power and ground lines having a conventional linear structure.

When the variations in EMI peak level are compared from portion A of FIG. 7A and portion B of FIG. 7B, the EMI level of the LCD samples with the zigzagging/meandering structure were reduced by 5 dB when compared to the EMI level of the comparison samples with the conventional linear structure. Thus, the EMI level of the LCD may be reduced by providing power and ground lines with a plurality of bent portions, which increases their relative lengths, thus increasing the inductances of the power and ground lines.

FIG. 8 is a table showing EMI levels for different inductance levels. The EMI levels were measured from a display system including power and ground lines having a zigzagging/meandering structure (FIG. 7A) according to example embodiments. FIG. 8 shows that the EMI level decreases as the inductance level increases.

The use of the line patterns described herein having a plurality of bent portions may increase the inductances of the power, ground, and/or signal lines that may be used to connect the semiconductor chip 140 (which may generate an electromagnetic (EM) field) to the PCB 130 (which may possibly act as an antenna), the semiconductor chip 140 to the screen 110, and the PCB 130 to the screen 110. Therefore, the transmission of high-frequency noises may be reduced between the semiconductor chip 140 and the PCB 130, the semiconductor chip 140 and the screen 110, and the PCB 130 and the screen 110. As a result, EMI levels may be reduced without adversely increasing the manufacturing costs of the display system 100.

While example embodiments have been shown and described herein, it will be understood by those of ordinary skill in the art that the specification is not limited thereto and that various changes/modifications/alterations may be made herein without departing from the spirit and scope of the teachings.

What is claimed is:

1. An interconnection substrate comprising:
   a base film having a mounting surface;
   at least one signal line provided on the base film;
   at least one power line provided on the base film as a coplanar power line pattern having a plurality of bent portions, the power line having a continuous form with a first section and a second section spaced apart from each other, the first section and the second section extending in parallel to each other and facing each other; and
   at least one ground line provided on the base film as a coplanar ground line pattern, the ground line being in parallel with the at least one power line, the ground line having a continuous line section extending alongside the power line around at least three consecutive bent portions of the plurality of bent portions.

2. The interconnection substrate of claim 1, wherein the base film comprises:
   a first surface and
   a second surface on the opposite side of the first surface, wherein the first surface is the mounting surface and at least one of the signal, power, and ground lines are provided on at least one of the first and second surfaces.

3. The interconnection substrate of claim 2, further comprising a plurality of via holes extending from the first surface to the second surface, wherein at least one of the signal, power, and ground lines extend from the first surface to the second surface through the plurality of via holes.

4. The interconnection substrate of claim 1, wherein the power line pattern is at least one of a zigzag, a loop, a spiral, and a coil.

5. The interconnection substrate of claim 1, wherein the at least one signal line is a line pattern having a plurality of bent portions.

6. The interconnection substrate of claim 5, wherein the signal line pattern is at least one of a zigzag, a loop, a spiral, and a coil.

7. A semiconductor chip package, comprising:
the interconnection substrate of claim 1; and
at least one semiconductor chip mounted on the mounting surface of the base film, wherein at least one of the signal, power, and ground lines are electrically connected to the at least one semiconductor chip.

8. The semiconductor chip package of claim 7, wherein the base film comprises:
a first surface and
a second surface on the opposite side of the first surface, wherein the first surface is the mounting surface and at least one of the signal, power, and ground lines are provided on at least one of the first and second surfaces.

9. The semiconductor chip package of claim 8, further comprising a plurality of via holes extending from the first surface to the second surface, wherein at least one of the signal, power, and ground lines extend from the first surface to the second surface through the plurality of via holes.

10. The semiconductor chip package of claim 7, wherein the power line pattern is at least one of a zigzag, a loop, a spiral, and a coil.

11. The semiconductor chip package of claim 7, wherein the at least one signal line is a line pattern having a plurality of bent portions.

12. The semiconductor chip package of claim 11, wherein the signal line pattern is at least one of a zigzag, a loop, a spiral, and a coil.

13. A display system comprising:
the semiconductor chip package of claim 7;
a screen displaying an image; and
a printed circuit board generating a signal,
wherein the at least one semiconductor chip is connected between the printed circuit board and the screen and relays the generated signal from the printed circuit board to the screen.

14. The display system of claim 13, wherein the base film comprises:
a first surface and
a second surface on the opposite side of the first surface, wherein the first surface is the mounting surface and at least one of the signal, power, and ground lines are provided on at least one of the first and second surfaces.

15. The display system of claim 14, further comprising a plurality of via holes extending from the first surface to the second surface, wherein at least one of the signal, power, and ground lines extend from the first surface to the second surface through the plurality of via holes.

16. The display system of claim 13, wherein the power line pattern is at least one of a zigzag, a loop, a spiral, and a coil.

17. The display system of claim 13, wherein the at least one signal line is a line pattern having a plurality of bent portions.

18. The display system of claim 17, wherein the signal line pattern is at least one of a zigzag, a loop, a spiral, and a coil.

19. The display system of claim 13, wherein at least one of the signal, power, and ground lines electrically connect the semiconductor chip to the printed circuit board.

20. The display system of claim 13, wherein at least one of the signal, power, and ground lines electrically connect the screen to the printed circuit board.

21. The interconnection substrate of claim 1, wherein the continuous line section of the ground line has a third section extending in parallel with the power line between the first section and the second section of the power line.

22. The interconnection substrate of claim 1, wherein the continuous line section of the ground line is disposed within a distance from the power line such that a parasitic capacitance exists between the power line and the continuous line section of the ground line.

* * * * *